(12) United States Patent
Huang

(10) Patent No.: US 10,803,217 B2
(45) Date of Patent: Oct. 13, 2020

(54) INTEGRATED CIRCUIT CAPABLE OF BEING AUTOMATICALLY PROGRAMMED BY WAY OF PROGRAMMED PROCESSES

(71) Applicant: Fujian Zhongke Mingrun Technology (Group) Co., Ltd., Fujian (CN)

(72) Inventor: Mingling Huang, Guangdong (CN)

( * ) Notice: Subject to any disclaimer, the term of this patent is extended or adjusted under 35 U.S.C. 154(b) by 0 days.

(21) Appl. No.: 16/529,749

(22) Filed: Aug. 1, 2019

(65) Prior Publication Data

US 2020/0184032 A1 Jun. 11, 2020

(30) Foreign Application Priority Data

Dec. 7, 2018 (CN) .......................... 2018 1 1513985

(51) Int. Cl.
*G06F 30/331* (2020.01)
*G06F 9/30* (2018.01)
*G06F 30/327* (2020.01)

(52) U.S. Cl.
CPC ........ *G06F 30/331* (2020.01); *G06F 9/30134* (2013.01); *G06F 30/327* (2020.01)

(58) Field of Classification Search
USPC ........................................................ 716/117
See application file for complete search history.

(56) References Cited

U.S. PATENT DOCUMENTS

2006/0212679 A1* 9/2006 Alfano ...................... G06F 1/08
712/38
2013/0151919 A1* 6/2013 Huynh ................... H05B 45/50
714/746

* cited by examiner

*Primary Examiner* — Eric D Lee
(74) *Attorney, Agent, or Firm* — Prakash Nama; Global IP Services, PLLC

(57) ABSTRACT

An integrated circuit capable of being automatically programmed, having an oscillator, a reference voltage module, a voltage comparator, a signal filter, an address and data identifier, a logic controller, a shift register, an output register, a clamp voltage module, an address register, an address comparator, an address memory, an address programming controller, a programming signal detector, and an LED driver circuit module etc.

1 Claim, 1 Drawing Sheet

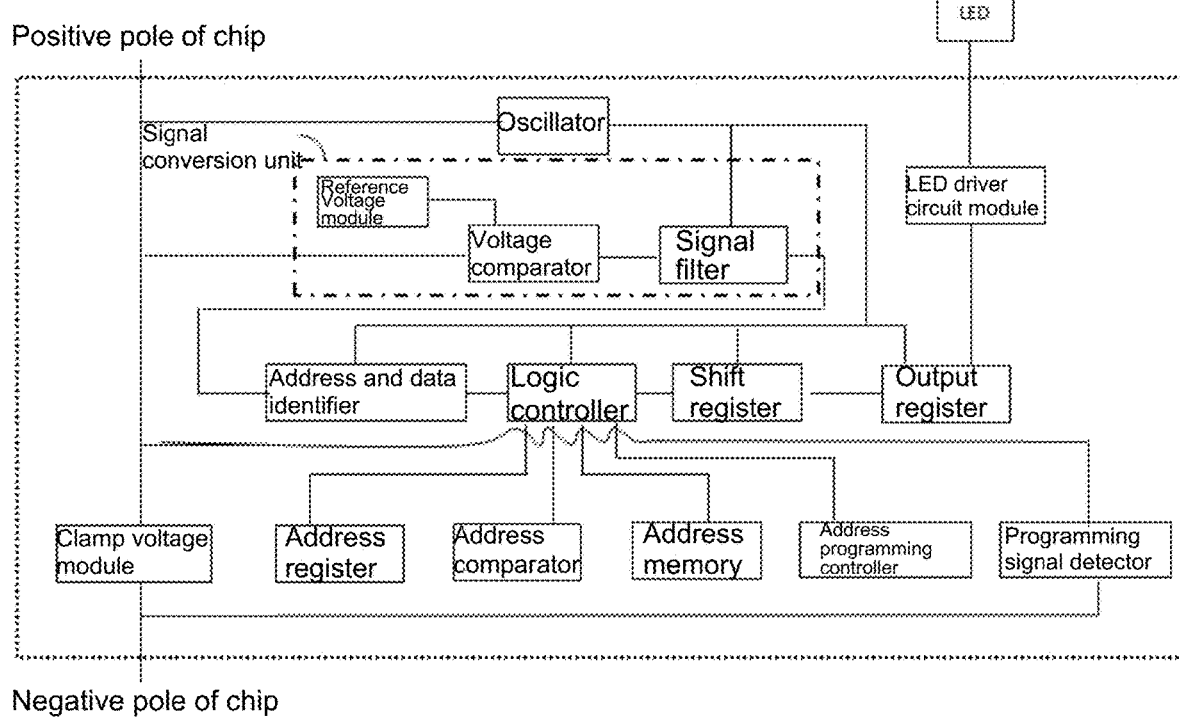

INTEGRATED CIRCUIT CAPABLE OF BEING AUTOMATICALLY PROGRAMMED BY WAY OF PROGRAMMED PROCESSES

BACKGROUND OF THE INVENTION

Currently, an integrated circuit (IC) still cannot achieve automatic programming by way of programmed processes. After the product is packaged, it is no longer possible to program an address data into the IC. Therefore, production of such an IC is not convenient.

BRIEF SUMMARY OF THE INVENTION

In view of the aforesaid disadvantage now present in the prior art, the present invention provides an integrated circuit capable of being automatically programmed by programmed processes.

The present invention is achieved as follows: An integrated circuit capable of being automatically programmed by programmed processes, comprising an oscillator, a reference voltage module, a voltage comparator, a signal filter, an address and data identifier, a logic controller, a shift register, an output register, a clamp voltage module, an address register, an address comparator, an address memory, an address programming controller, a programming signal detector, and an LED driver circuit module.

The reference voltage module, the voltage comparator, and the signal filter constitute a signal conversion unit.

A positive pole of a chip is connected to the oscillator, the voltage comparator, the programming signal detector and the clamp voltage module respectively in four ways.

The reference voltage module is connected to the voltage comparator; the voltage comparator, the signal filter, the address and data identifier, the logic controller, the shift register, the output register, the LED driver circuit module, and an LED lamp are sequentially connected; the address and data identifier, the logic controller, the shift register, the output register, and the signal filter are all connected to the oscillator.

The logic controller is connected to the address register, the address comparator, the address memory, and the address programming controller; the programming signal detector and the clamp voltage module are connected to a negative pole of the chip.

The oscillator provides a clock for the system.

The reference voltage module generates a reference voltage for the use by the voltage comparator.

The voltage comparator and the signal filter receive a power carrier signal to identify code 0 and code 1.

The address and data identifier correctly identifies an address data and an illumination data.

The logic controller is responsible for the logic of the entire chip.

The shift register is responsible for data shift.

The output register output registered data.

The clamp voltage module clamps a voltage between the power source and the ground.

The address register registers the address data in real time.

The address comparator compares the real time address data with the address data programmed into the chip and determine whether they match with each other.

The address memory stores the programmed address.

The address programming controller controls whether the chip performs programming of an address.

The programming signal detector detects whether there is an external signal that signifies the need for programming.

The LED driver circuit module controls how the LED lamp flashes according to the illumination data identified by the chip.

A working principle of programming of the present invention:

A power carrier signal is input from the positive pole of the chip to the signal conversion unit; as mentioned, the signal conversion unit comprises the reference voltage module, the voltage comparator and the signal filter; the voltage comparator detects voltage changes at the two poles of the chip, decodes the carrier signal on the power line, and obtains a code 0 or a code 1 after being processed by the signal filter; the signal obtained is sent to the address and data identifier. The address and data identifier identifies address data and illumination data.

When the programming signal detector inside the chip detects the presence of a programming signal, the address register receives the address data sent by the logic controller, and the address programming controller writes the address into the address memory, thereby achieving the programming of address.

When the logic controller sends the address data to the address register, the address comparator compares in real time the address data in the address register with the address data stored in the address memory; if the address data received by the address register matches the address data in the address memory, the logic controller sends the illumination data to the LED driver circuit module through the shift register and the output register; the LED driver circuit module drives the LED lamp according to the illumination data.

Compared with the prior art, the present invention has the following advantages: The integrated circuit (IC) provided by the present invention achieves automatic programming by way of programmed processes. Only a control signal is externally required to achieve the programming function. Therefore, after the product is packaged, it is still possible to program an address data into the IC.

BRIEF DESCRIPTION OF THE DRAWINGS

FIG. 1 is a schematic structural view of the present invention.

DETAILED DESCRIPTION OF THE INVENTION

The present invention will be further described in detail below with reference to the accompanying drawings.

As shown in FIG. 1, an integrated circuit capable of being automatically programmed by programming processes, comprising an oscillator, a reference voltage module, a voltage comparator, a signal filter, an address and data identifier, a logic controller, a shift register, an output register, a clamp voltage module, an address register, an address comparator, an address memory, an address programming controller, a programming signal detector, and an LED driver circuit module.

The reference voltage module, the voltage comparator, and the signal filter constitute a signal conversion unit.

A positive pole of a chip is connected to the oscillator, the voltage comparator, the programming signal detector and the clamp voltage module respectively in four ways.

The reference voltage module is connected to the voltage comparator; the voltage comparator, the signal filter, the address and data identifier, the logic controller, the shift register, the output register, the LED driver circuit module, and an LED lamp are sequentially connected; the address and data identifier, the logic controller, the shift register, the output register, and the signal filter are all connected to the oscillator.

The logic controller is connected to the address register, the address comparator, the address memory, and the address programming controller; the programming signal detector and the clamp voltage module are connected to a negative pole of the chip.

A working principle of programming of the present invention:

A power carrier signal is input from the positive pole of the chip to the signal conversion unit; as mentioned, the signal conversion unit comprises the reference voltage module, the voltage comparator and the signal filter; the voltage comparator detects voltage changes at the two poles of the chip, decodes the carrier signal on the power line, and obtains a code 0 or a code 1 after being processed by the signal filter; the signal obtained is sent to the address and data identifier. The address and data identifier identifies address data and illumination data.

When the programming signal detector inside the chip detects the presence of a programming signal, the address register receives the address data sent by the logic controller, and the address programming controller writes the address into the address memory, thereby achieving the programming of address.

When the logic controller sends the address data to the address register, the address comparator compares in real time the address data in the address register with the address data stored in the address memory; if the address data received by the address register matches the address data in the address memory, the logic controller sends the illumination data to the LED driver circuit module through the shift register and the output register; the LED driver circuit module drives the LED lamp according to the illumination data.

Only an embodiment of the present invention is described above. The embodiment as described does not limit the scope of the present invention. Any alternative configurations with respect to structures or processes made in accordance with the teachings of the description and the drawings, or applications of the present invention directly or indirectly on other related field of art should fall within the scope of protection of the present invention.

What is claimed is:

1. An integrated circuit capable of being automatically programmed, comprising an oscillator, a reference voltage module, a voltage comparator, a signal filter, an address and data identifier, a logic controller, a shift register, an output register, a clamp voltage module, an address register, an address comparator, an address memory, an address programming controller, a programming signal detector, and an LED driver circuit module;

the reference voltage module, the voltage comparator, and the signal filter constitute a signal conversion unit;

a positive pole of a chip is connected to the oscillator, the voltage comparator, the programming signal detector and the clamp voltage module respectively in four ways;

the reference voltage module is connected to the voltage comparator; the voltage comparator, the signal filter, the address and data identifier, the logic controller, the shift register, the output register, the LED driver circuit module, and an LED lamp are sequentially connected; the address and data identifier, the logic controller, the shift register, the output register, and the signal filter are all connected to the oscillator;

the logic controller is connected to the address register, the address comparator, the address memory, and the address programming controller;

the programming signal detector and the clamp voltage module are connected to a negative pole of the chip.

* * * * *